United States Patent
Zhang et al.

(10) Patent No.: US 10,208,380 B2
(45) Date of Patent: Feb. 19, 2019

(54) ADVANCED COATING METHOD AND MATERIALS TO PREVENT HDP-CVD CHAMBER ARCING

(71) Applicant: Applied Materials, Inc., Santa Clara, CA (US)

(72) Inventors: Lin Zhang, San Jose, CA (US); Xuesong Lu, Santa Clara, CA (US); Andrew V. Le, Los Gatos, CA (US); Jang Seok Oh, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/334,431

(22) Filed: Oct. 26, 2016

(65) Prior Publication Data
US 2017/0159176 A1    Jun. 8, 2017

Related U.S. Application Data

(60) Provisional application No. 62/299,790, filed on Feb. 25, 2016, provisional application No. 62/263,491, filed on Dec. 4, 2015.

(51) Int. Cl.
*C23C 16/455* (2006.01)
*C23C 16/34* (2006.01)
(Continued)

(52) U.S. Cl.
CPC .......... *C23C 16/4558* (2013.01); *C23C 16/34* (2013.01); *C23C 16/403* (2013.01);
(Continued)

(58) Field of Classification Search
CPC .............. C23C 16/4558; C23C 16/507; C23C 16/4404; C23C 16/34; C23C 16/505;
(Continued)

(56) References Cited

U.S. PATENT DOCUMENTS 4,512,283 A * 4/1985 Bonifield ............ C23C 16/5096
                                                              118/50.1
4,664,747 A * 5/1987 Sekiguchi .......... H01L 21/3185
                                                              118/50.1
(Continued)

FOREIGN PATENT DOCUMENTS

EP      0965655 A2    12/1999
JP    2000277509 A *  10/2000
(Continued)

OTHER PUBLICATIONS

International Search Report and Written Opinion dated Jan. 31, 2017 for Application No. PCT/US2016/058923.

*Primary Examiner* — Rudy Zervigon
(74) *Attorney, Agent, or Firm* — Patterson | Sheridan LLP

(57) ABSTRACT

Embodiments described herein relate to apparatus and coating methods to reduce chamber arcing, for example, in HDP-CVD, PECVD, PE-ALD and Etch chambers. The apparatus include a ring shaped gas distributor used for in-situ deposition of coating materials, and a process chamber including the same. The ring shaped gas distributor includes a ring shaped body having at least one gas entrance port disposed on a first side thereof and a plurality of gas distribution ports disposed on a first surface of the ring shaped body. The plurality of gas distribution ports are arranged in a plurality of evenly distributed rows. The plurality of gas distribution ports in a first row of the plurality of evenly distributed rows is adapted to direct gas at an exit angle different from an exit angle of the plurality of gas distribution ports in a second row of the plurality of evenly distributed rows.

20 Claims, 5 Drawing Sheets

(51) Int. Cl.
  *C23C 16/40* (2006.01)
  *C23C 16/505* (2006.01)
  *C23C 16/44* (2006.01)
  *C23C 16/507* (2006.01)
  *H01J 37/32* (2006.01)

(52) U.S. Cl.
  CPC .... *C23C 16/4404* (2013.01); *C23C 16/45536* (2013.01); *C23C 16/45544* (2013.01); *C23C 16/505* (2013.01); *C23C 16/507* (2013.01); *H01J 37/3244* (2013.01); *H01J 37/32449* (2013.01)

(58) Field of Classification Search
  CPC ............ C23C 16/45544; C23C 16/403; C23C 16/45536; H01J 37/32
  USPC ...................................... 118/715; 156/345.33
  See application file for complete search history.

(56) References Cited

U.S. PATENT DOCUMENTS

| | | | | |
|---|---|---|---|---|
| 4,761,269 | A * | 8/1988 | Conger | C23C 16/45561 118/679 |
| 4,989,540 | A * | 2/1991 | Fuse | C23C 16/4405 118/715 |
| 5,105,761 | A * | 4/1992 | Charlet | H01J 37/3244 118/719 |
| 5,169,509 | A * | 12/1992 | Latz | C23C 14/0063 204/192.13 |
| 5,188,671 | A * | 2/1993 | Zinck | C30B 23/06 118/715 |
| 5,330,352 | A * | 7/1994 | Watanabe | C30B 31/16 432/152 |
| 5,338,363 | A * | 8/1994 | Kawata | C23C 16/45512 118/715 |
| 5,522,934 | A * | 6/1996 | Suzuki | C23C 16/455 118/723 AN |
| 5,522,936 | A * | 6/1996 | Tamura | C23C 16/4401 118/723 ER |
| 5,592,581 | A * | 1/1997 | Okase | C23C 16/46 118/50.1 |
| 5,614,055 | A * | 3/1997 | Fairbairn | H01J 37/321 118/723 AN |
| 5,620,523 | A * | 4/1997 | Maeda | H01J 37/3211 118/715 |
| 5,686,151 | A * | 11/1997 | Imai | C23C 16/408 257/E21.664 |
| 5,792,272 | A * | 8/1998 | van Os | C23C 16/4405 118/723 I |
| 5,851,294 | A * | 12/1998 | Young | C23C 16/45508 118/715 |
| 5,884,009 | A * | 3/1999 | Okase | H01L 21/67017 219/405 |
| 5,885,358 | A * | 3/1999 | Maydan | C23C 16/455 118/715 |
| 5,900,103 | A * | 5/1999 | Tomoyasu | C23C 16/4405 118/723 E |
| 6,013,155 | A * | 1/2000 | McMillin | C23C 16/455 118/723 I |
| 6,106,737 | A * | 8/2000 | Tomoyasu | C23C 16/4405 204/192.12 |
| 6,111,225 | A * | 8/2000 | Ohkase | H01L 21/67109 118/724 |
| 6,132,552 | A * | 10/2000 | Donohoe | C23C 16/4405 118/723 I |
| 6,139,642 | A * | 10/2000 | Shimahara | C23C 16/4401 118/715 |
| 6,143,081 | A * | 11/2000 | Shinriki | C23C 16/405 118/715 |
| 6,178,918 | B1 * | 1/2001 | van Os | C23C 16/4405 118/715 |
| 6,206,976 | B1 * | 3/2001 | Crevasse | C23C 16/45521 118/500 |
| 6,270,862 | B1 * | 8/2001 | McMillin | C23C 16/455 427/569 |
| 6,299,725 | B1 * | 10/2001 | Donohoe | C23C 16/4405 118/723 I |
| 6,302,962 | B1 * | 10/2001 | Nam | C30B 31/12 118/696 |
| 6,323,133 | B1 * | 11/2001 | Donohoe | C23C 16/4405 118/723 I |
| 6,365,016 | B1 * | 4/2002 | Iacovangelo | C23C 14/228 204/192.38 |
| 6,375,750 | B1 * | 4/2002 | van Os | C23C 16/4405 118/500 |
| 6,383,334 | B1 * | 5/2002 | Donohoe | C23C 16/4405 118/723 I |
| 6,387,816 | B2 * | 5/2002 | Donohoe | C23C 16/4405 438/710 |
| 6,446,572 | B1 * | 9/2002 | Brcka | C23C 14/32 118/723 AN |
| 6,478,877 | B1 * | 11/2002 | Sillmon | C23C 16/4412 118/715 |
| 6,497,783 | B1 * | 12/2002 | Suzuki | H01J 37/32192 156/345.1 |
| 6,613,189 | B2 * | 9/2003 | Donohoe | C23C 16/4405 118/723 I |
| 6,617,256 | B2 * | 9/2003 | Donohoe | C23C 16/4405 118/723 I |
| 6,666,920 | B1 * | 12/2003 | Sillmon | C23C 16/4412 118/715 |
| 6,676,758 | B2 * | 1/2004 | Sillmon | C23C 16/4412 118/715 |
| 6,716,289 | B1 * | 4/2004 | Sillmon | C23C 16/4412 118/715 |
| 6,808,567 | B2 * | 10/2004 | Takeshita | H01L 21/67017 118/715 |
| 6,815,370 | B2 * | 11/2004 | Han | C23C 16/345 257/9 |
| 6,835,277 | B2 * | 12/2004 | Park | H01J 37/32357 118/723 ME |
| 6,837,967 | B1 | 1/2005 | Berman et al. | |
| 6,846,364 | B2 * | 1/2005 | Pyo | C23C 16/44 118/715 |
| 6,890,596 | B2 * | 5/2005 | Sarigiannis | C23C 16/4401 134/1.1 |
| 6,914,007 | B2 | 7/2005 | Ma et al. | |
| 6,972,055 | B2 * | 12/2005 | Sferlazzo | C23C 16/45508 118/719 |
| 7,109,114 | B2 | 9/2006 | Chen et al. | |
| 7,303,141 | B2 * | 12/2007 | Han | C23C 16/4558 118/715 |
| 7,468,104 | B2 * | 12/2008 | Mardian | C23C 16/4401 118/715 |
| 7,745,350 | B2 | 6/2010 | Wang et al. | |
| 7,749,326 | B2 * | 7/2010 | Kim | C23C 16/45508 118/715 |
| 7,806,078 | B2 * | 10/2010 | Yoshida | C23C 16/455 118/723 I |
| 7,846,291 | B2 * | 12/2010 | Otsuki | C23C 16/4404 118/723 R |
| 7,862,683 | B2 * | 1/2011 | Fukiage | C23C 16/4405 118/715 |
| 7,879,183 | B2 * | 2/2011 | Yousif | H01L 21/6708 118/715 |
| 7,887,669 | B2 * | 2/2011 | Satou | H01J 37/32449 156/345.1 |
| 8,277,561 | B2 * | 10/2012 | Kim | C23C 16/45508 118/715 |
| 8,298,338 | B2 * | 10/2012 | Kim | C23C 16/4412 118/715 |
| 8,329,593 | B2 * | 12/2012 | Yousif | H01J 37/32357 216/58 |
| 8,450,191 | B2 | 5/2013 | Wang et al. | |
| 8,683,943 | B2 * | 4/2014 | Onodera | C23C 16/402 118/666 |
| 9,175,394 | B2 * | 11/2015 | Yudovsky | C23C 16/45504 |
| 9,410,247 | B2 * | 8/2016 | Lee | C23C 16/45578 |
| 9,951,421 | B2 * | 4/2018 | Lind | H01J 37/32357 |

(56) References Cited

U.S. PATENT DOCUMENTS

| | | | | |
|---|---|---|---|---|
| 2001/0003271 | A1* | 6/2001 | Otsuki | C23C 16/4404 118/723 I |
| 2004/0099378 | A1* | 5/2004 | Kim | C23C 16/4558 156/345.33 |
| 2008/0057740 | A1 | 3/2008 | Munro et al. | |
| 2008/0069966 | A1* | 3/2008 | Otsuki | C23C 16/4404 427/453 |
| 2008/0102208 | A1* | 5/2008 | Wu | C23C 16/4404 427/255.28 |
| 2009/0165713 | A1* | 7/2009 | Kim | C23C 16/4412 118/719 |
| 2009/0260569 | A1* | 10/2009 | Kim | C23C 16/45508 118/715 |
| 2009/0260572 | A1* | 10/2009 | Kim | C23C 16/45508 118/730 |
| 2011/0240598 | A1* | 10/2011 | Okayama | C23C 16/452 216/69 |
| 2013/0098293 | A1* | 4/2013 | Lee | C23C 16/45565 118/728 |
| 2013/0098455 | A1* | 4/2013 | Ng | C23C 16/303 137/1 |
| 2014/0166618 | A1* | 6/2014 | Tadigadapa | H01J 37/32357 216/67 |
| 2016/0168705 | A1* | 6/2016 | Lind | H01J 37/32357 239/413 |

FOREIGN PATENT DOCUMENTS

| | | | | |
|---|---|---|---|---|
| JP | 2003328135 A | * | 11/2003 | |
| JP | 2009-070948 A | | 4/2009 | |
| JP | 2009302324 A | * | 12/2009 | C23C 16/4558 |
| JP | 2010-118462 A | | 5/2010 | |
| KR | 1020050042701 | | 5/2005 | |
| WO | WO-9715698 A1 | * | 5/1997 | C23C 16/45508 |

\* cited by examiner

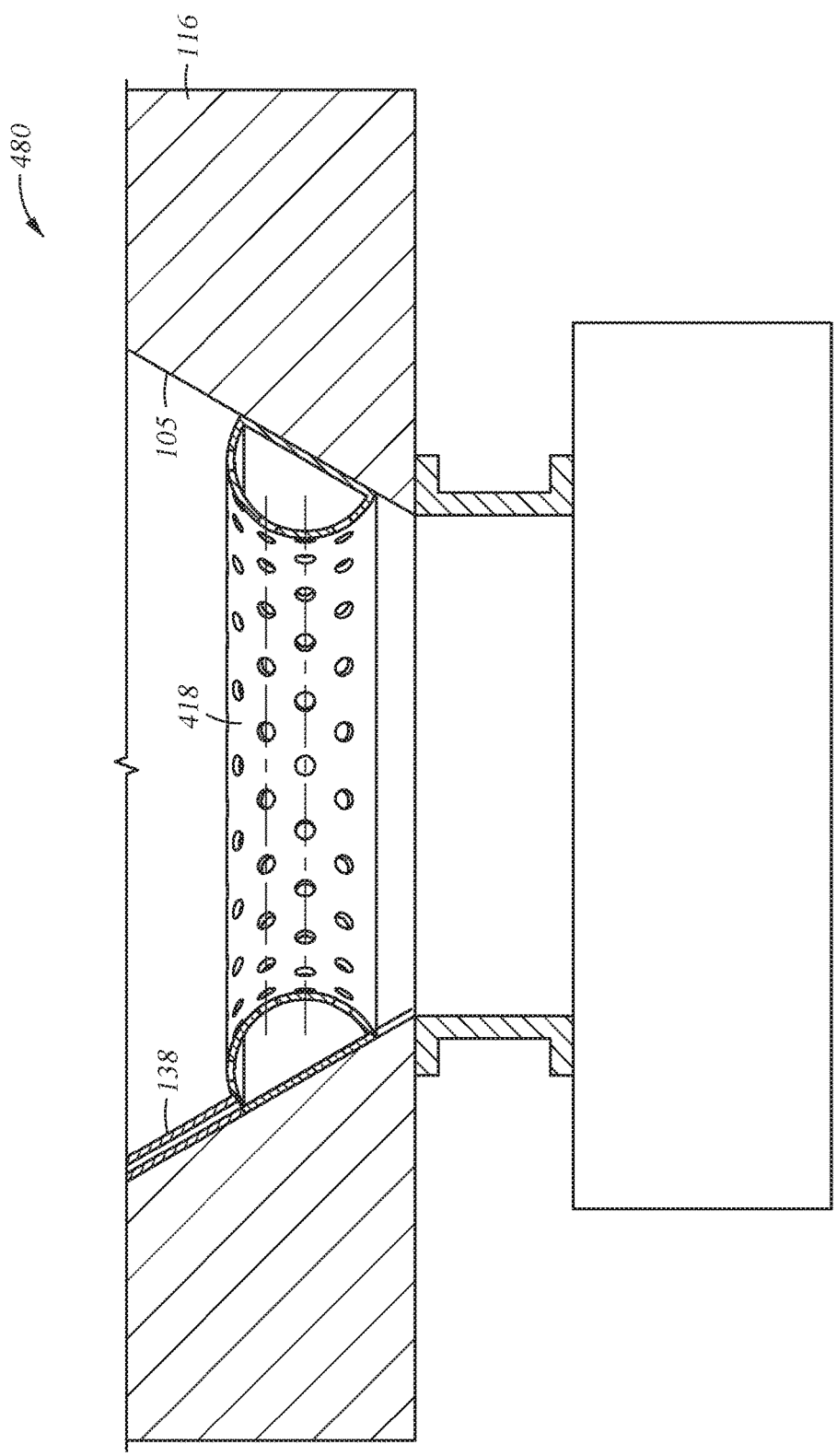

ADVANCED COATING METHOD AND MATERIALS TO PREVENT HDP-CVD CHAMBER ARCING

CROSS-REFERENCE TO RELATED APPLICATIONS

This application claims benefit of U.S. Provisional Patent Application No. 62/263,491, filed Dec. 4, 2015, and U.S. Provisional Patent Application No. 62/299,790, filed Feb. 25, 2016, each of which is herein incorporated by reference.

BACKGROUND

Field

Embodiments of the present disclosure generally relate to apparatuses and coating methods to reduce HDP-CVD chamber arcing.

Description of the Related Art

High-Density Plasma Chemical Vapor Deposition (HDP-CVD) employs an inductively coupled plasma source for generation of higher density plasma at low vacuum pressures. The higher density plasma results in superior gap fill performance, high quality film deposition at lower temperatures, high throughput and easy serviceability. The reactor design and process technology of HDP-CVD enables deposition of both undoped and doped films for a wide range of applications, including shallow trench isolation (STI), pre-metal dielectric layers (PMD), interlevel dielectric (ILD) layers, intermetal dielectric (IMD) layers, and passivation. Therefore, HDP-CVD is widely used in the semiconductor industry.

Due to the low process pressure, one of the key issues reported in HDP-CVD chambers is chamber arcing. Arcing occurs when high concentrated E-field at a sharp point causes dielectric break down at the metallic chamber wall, gas ring and cathode body. The high discharge current, which takes place over a small area, vaporizes exposed metal and contaminates substrate surfaces, resulting in decreased process yield.

Various techniques have been suggested to reduce chamber arcing. For example, an external coating method may be used on a new chamber, pre-installation. However, the coating must be reapplied when the pre-installation coating cracks during transportation, installation, or maintenance, or once the coating layer becomes too thin. A seasoning layer may be deposited on metallic chamber surfaces during seasoning operations, after chamber cleaning, to alleviate the arcing. However, conventional seasoning layers provide insufficient coverage on chamber components, and thus, chamber arcing issues still exist.

Therefore, there is a need for improved apparatuses and coating methods to reduce HDP-CVD chamber arcing.

SUMMARY

In one implementation, a ring shaped gas distributor is disclosed. The ring shaped gas distributor includes a ring shaped body having at least one gas entrance port disposed on a first side thereof and a plurality of gas distribution ports disposed on a first surface of the ring shaped body. The plurality of gas distribution ports are arranged in a plurality of evenly distributed rows. A first gas distribution port of the plurality of gas distribution ports in a first row of the plurality of evenly distributed rows is adapted to direct gas at an exit angle different from an exit angle of a second gas distribution port of the plurality of gas distribution ports in the first row of the plurality of evenly distributed rows.

In another implementation, a process chamber is disclosed. The process chamber includes a chamber body and a dome lid assembly disposed on the chamber body, a substrate support positioned in the chamber body, a gas inlet mounted on the dome lid assembly, and a ring shaped gas distributor. The ring shaped gas distributor includes a ring shaped body and a plurality of gas distribution ports disposed on a first surface of the ring shaped body.

In yet another implementation, a method is disclosed. The method includes flowing a first precursor into a process chamber through a first gas inlet, ionizing the first precursor, flowing a second precursor into the process chamber through a ring shaped body adapted to distribute the second precursor, the second precursor being different than the first precursor, ionizing the second precursor, and depositing a seasoning material from the ionized second precursor on an internal surface of the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

FIG. 4A is schematic view of a portion of a process chamber according to another embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and coating methods to reduce chamber arcing, for example, in HDP-CVD, PECVD, PE-ALD and Etch chambers. The apparatus include a ring shaped gas distributor suitable for in-situ deposition of coating materials, and a process chamber including the same. The ring shaped gas distributor may include one or more gas entrance ports, and plurality of gas distribution ports. The ring shaped gas distributor may be positioned in a lower portion of a process chamber, such as a plasma enhanced chemical vapor deposition (PECVD) chamber, to provide a precursor gas to the lower portion of the process chamber for deposition of a seasoning material. Embodiments described herein also include a method for seasoning a process chamber. The method includes flowing a first precursor into a process chamber through a first gas inlet, and flowing a seasoning precursor into the process chamber through a ring shaped gas distributor. The first and second precursor may be ionized and reacted to deposit a seasoning material in the process chamber.

Figure 1:
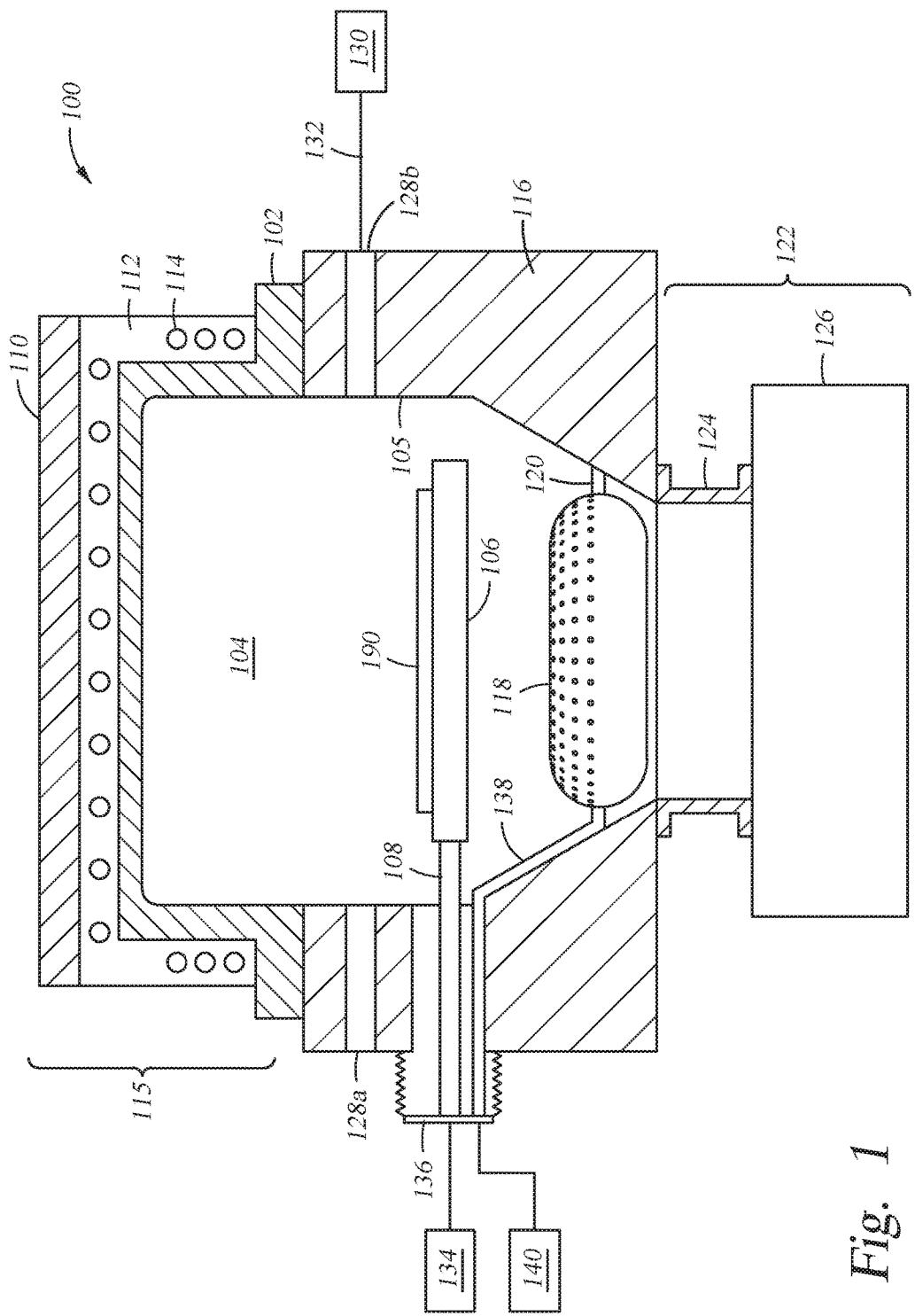
FIG. 1 is a schematic view of a process chamber according to one embodiment described herein.

FIG. 1 is a schematic view a process chamber 100 according to one embodiment described herein. In one example, the process chamber 100 may be a high density plasma chemical vapor deposition (HDP-CVD) system. The process chamber 100 includes a chamber body 116, a substrate support 106, and a dome lid assembly 115 that includes a dome 102, an inductive assembly 112 and a temperature control plate 110. The dome 102 is positioned on the chamber body 116. The dome 102 and the chamber body 116 define an internal volume of the process chamber 100. The substrate support 106 is located within the internal volume of the process chamber 100 and supports a substrate 190 thereon during processing. A substrate support arm 108 is coupled to the substrate support 106 to facilitate support and actuation of the substrate support 106. An actuator 134 is coupled to the substrate support arm 108 through bellows 136. The actuator 134 vertically actuates the substrate support arm 108 and substrate support 106 coupled thereto to facilitate substrate transfer between a substrate transfer robot (not shown) and the substrate support 106 during a substrate transfer process.

The dome 102 defines an upper boundary of a plasma processing region 104 located within the process chamber 100. The dome 102 may be made of a ceramic dielectric material, such as aluminum, aluminum oxide or aluminum nitride. The lower boundary of the plasma processing region 104 is defined by the upper surface of a substrate support 106. During processing, a plasma or other ionized gas may be generated within the plasma processing region 104 to facilitate processing of a substrate 190. For example, a plasma may be generated in the plasma processing region 104 to deposit a material on the substrate 190 in a HDP-CVD, plasma-enhanced chemical vapor deposition (PECVD) or plasma enhanced atomic layer deposition (PE-ALD) process.

An inductive assembly 112 including one or more inductive coils 114 is positioned over the dome 102 to facilitate plasma generation in the plasma processing region 104. A power source (not shown) may be coupled to the inductive assembly 112 to provide power to the one or more inductive coils 114. During operation, the plurality of inductive coils 114 may provide radio frequency (RF) power to one or more precursor or process gases located within the plasma processing region 104 to ionize the precursor or process gases. In one example, the plurality of inductive coils 114 may provide up to 5,000 watts of RF power at nominally 2 MHz. The operating frequency of the plurality of inductive coils 114 may be offset from the nominal operating frequency to improve plasma-generation efficiency. A temperature control plate 110 is positioned over the inductive assembly 112 and is thermally coupled to the dome 102 through the inductive assembly 112. The temperature control plate 110 allows for control of the dome temperature within about ±10° C. over a range of about 100° C. to 200° C. The temperature control plate 110 facilitates optimization of dome temperature for various processes. In one example, a liquid coolant may flow through the inductive coils 114 to facilitate cooling of the inductive coils in addition to or as an alternative to the temperature control provided by the temperature control plate 110.

The process chamber 100 includes a gas panel 130 adapted to store one or more precursor or process gases utilized during processing, such as a HDP-CVD, PECVD or PEALD process. The precursor or process gases may be introduced to the plasma processing region 104 through one or more gas inlets 128 (two are shown as 128a, 128b), which are mounted to the dome lid assembly 115. The one or more gas inlets 128a, 128b are coupled to the gas panel 130 through one or more gas supply lines 132 (one of which is shown). In one embodiment, the one or more gas inlets 128 may be configured as a single gas ring. In another embodiment, the one or more gas inlets 128 may be configured as a top baffle. A process gas, such as a precursor gas or other gas used during processing, or reacted byproducts thereof, may be exhausted from the process chamber 100 by a pumping system 122. The pumping system 122 is joined to a lower portion of the process chamber 100 and includes a throttle valve 124 and a pump 126. The throttle valve 124 couples the pump 126 to the chamber body 116. The throttle valve 124 may be activated to control of chamber pressure by restricting the rate of exhaust flow exiting the process chamber 100 through the pump 126.

A ring shaped gas distributor 118 is positioned in the lower portion of the chamber body 116 between the throttle valve 124 and the substrate support 106. The ring shaped gas distributor 118 includes a hollow tubular ring having one or more gas entrance ports and gas distribution ports to distribute process or precursor gasses in a lower portion of the process chamber 100. The ring shaped gas distributor 118 may be attached to an internal surface 105 of the chamber body 116 by an attachment 120. The attachment 120 may be a spring-loaded clip, bracket, fastener, or the like. Precursor or process gases are supplied from a second gas panel 140 to the ring shaped gas distributor 118 through a gas supply line 138. The gas supply line 138 may be routed through the bellows 136 adjacent the substrate support arm 108. Alternatively, the gas supply line 138 may be routed through gas inlets 128a, 128b.

A process gas, such as a precursor gas or other gas used during processing, is supplied to the ring shaped gas distributor 118 from the second gas panel 140 is distributed in the lower portion of the process chamber 100 to facilitate formation of a seasoning layer on the internal surface 105 of the chamber body 116. The ring shaped gas distributor 118 is adapted to evenly distribute gases into the lower portion of the process chamber 100 to form a more uniform seasoning layer than conventional approaches, thus reducing the likelihood of undesired arcing. The ring shaped gas distributor 118 may have a diameter that is smaller than the diameter of the internal surface 105 of the chamber body 116. In one example, the ring shaped gas distributor may have a diameter that is about 3 percent to about 20 percent smaller than the diameter of the internal surface 105. The ring shaped gas distributor 118 may be made of a metal, metal alloy, or a ceramic material. In one embodiment, the ring shaped gas distributor 118 is made of the same material as the chamber body 116, so as to prevent metal contamination. In another embodiment, the ring shaped gas distributor 118 may be made of aluminum oxide. In another embodiment, the ring shaped gas distributor 118 may be made of aluminum nitride. In yet another embodiment, the ring shaped gas distributor 118 may be made of aluminum.

Figure 2:
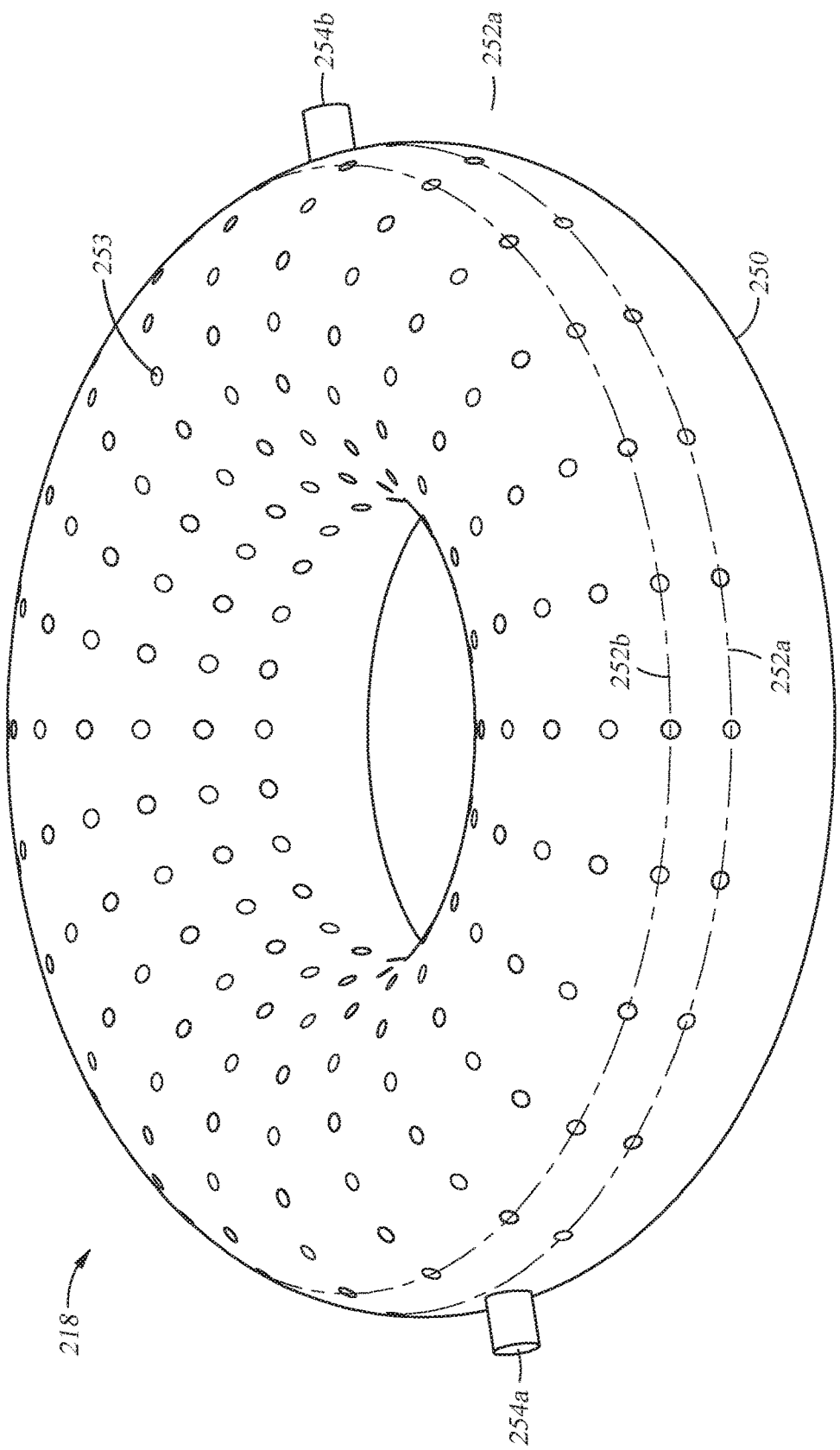
FIG. 2 is a schematic view of a ring shaped gas distributor according to one embodiment described herein.

FIG. 2 is a schematic view of the ring shaped gas distributor 118. The ring shaped gas distributor 118 is a ring shaped gas distributor that includes a hollow ring shaped body 250 having two gas entrance ports 254a and 254b disposed on opposite sides thereof and a plurality of gas distribution ports 253 disposed on a first surface of the ring shaped body 250. In one example, an upper half of the ring shaped body 250 may include gas distribution ports 253 to direct gas upward to facilitate seasoning of the internal surface 105 of the process chamber 100 as shown in FIG. 1. In one embodiment, each of the plurality of gas distribution ports 253 is about 0.5 millimeters (mm) to about 3 mm in diameter, such as about 1 mm in diameter.

The plurality of gas distribution ports 253 may be arranged in a plurality of rows 252a, 252b (two of which are labeled). Row 252a may represent a first row and row 252b may represent a second row. A plurality of rows may be evenly distributed in concentric circles around the circumference of the body 250. Lines have been included between the ports 253 of the rows 252a and 252b to show the distribution of the rows in concentric circles. The ports 253 comprising each row may also be radially aligned with a centerline of the body 250. The plurality of gas distribution ports 253 in the first row 252a is positioned to direct exiting gas at an angle different from the exit angle of adjacent rows, such as the second row 252b. In other words, each row of the plurality of gas distribution ports 252 is adapted to direct exiting gas at a different angle than adjacent rows. In another example, the gas distribution ports 253 of a particular row may be grouped into triplets, with each gas distribution port of the triplet having a different gas exit angle. The three different angles may be repeated for each triplet of gas distribution ports 253 in a single row, such as row 252a or row 252b. The variations in the exit angle between adjacent rows 252a, 252b, or between adjacent gas distribution ports 253 may be controlled by the diameter of the first surface of the gas distribution device 218. The relative difference of the exit angles may be between about 15 degrees and about 30 degrees. In one embodiment, the spacing between each gas distribution port 253 of the plurality of gas distribution ports 253 is between about 1 centimeter (cm) and about 3 cm, such as about 1 cm.

Although FIG. 2 illustrates one embodiment of a ring shaped gas distributor 118, other embodiments are also contemplated. In another embodiment, the ring shaped gas distributor 118 may include more or less than two gas entrance ports 254a, 254b. In such an example, the gas entrance ports may be positioned at even intervals around the outer circumference of the ring shaped gas distributor 118. Additionally, it is contemplated that the gas distribution ports 253 may be unevenly distributed to affect a gas flow within the process chamber 100. Also, the adjacent rows 252a, 252b may also be unevenly distributed. The uneven distribution may compensate for non-symmetrical features of the process chamber 100, or differences in gas flow profiles within the process chamber 100. Moreover, while the gas distributor 118 is illustrated has having a ring-shaped body, it is contemplated that other shapes, such as elliptical, may be utilized to affect a gas flow within a process chamber.

Figure 3:
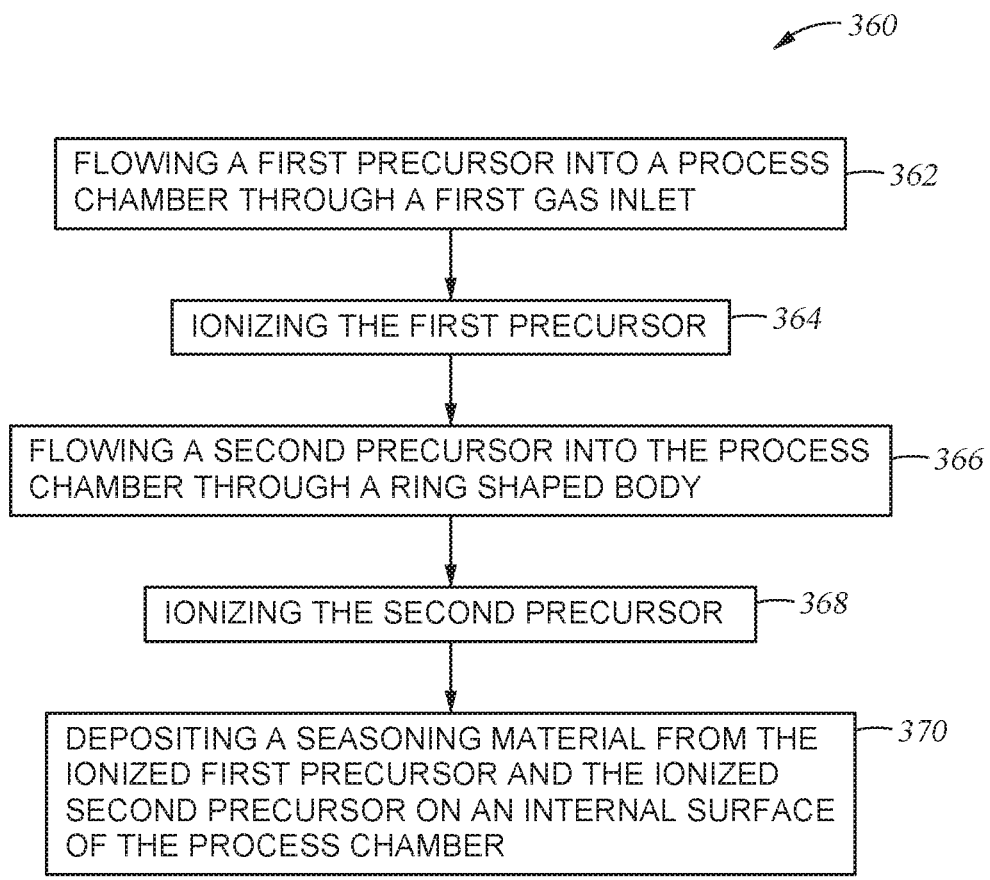
FIG. 3 illustrates is a flow diagram of a method according to one embodiment described herein.

FIG. 3 illustrates a flow diagram of a method 360 according to one embodiment described herein. To facilitate understanding of embodiments of the disclosure, FIG. 3 will be discussed in conjunction with FIG. 1. The method 360 may be utilized to deposit a seasoning material on internal surfaces 105 of the process chamber 100. Method 360 begins at operation 362. At operation 362, a processing gas, for example a first precursor, is introduced into the process chamber 100 through one or both of the gas inlets 128a or 128b. The first precursor may be an oxygen precursor or a nitrogen precursor. Exemplary first precursors include, but are not limited to, water ($H_2O$), ozone ($O_3$), oxygen ($O_2$), nitrogen ($N_2$), and ammonia ($NH_3$). The first precursor is ionized at operation 364. The ionized first precursor forms a monolayer on the internal surface 105 of the process chamber 100.

At operation 366 a second precursor is introduced into the process chamber 100 through the ring shaped gas distributor 118. The introduced ring shaped gas distributor 118 directs the precursors over portions of the chamber that are generally unreachable or poorly reached if the second precursor was solely introduced through the gas inlets 128a, 128b disposed above the substrate support 106. The second precursor material may be an aluminum-containing precursor, or any other metal-containing precursor. Exemplary second precursors include, but are not limited to, trimethylaluminum (TMA) or aluminum chloride ($AlCl_3$). The second precursor is ionized in operation 368.

At operation 370, the ionized second precursor adsorbs to or reacts with the monolayer of the first precursor formed on the internal surface 105. Absorption or reaction of the second monolayer results in formation of a seasoning material on the internal surface 105 of the chamber body 116 of the process chamber 100. The seasoning material may include any dielectric material that has one or more of the follow characteristics: (1) high breakdown voltage, such as more than 7 MV/cm, (2) is resistant to fluorine (F) radicals, (3) minimal particle contamination concern, or (4) minimal metal contamination concern. In one embodiment, the seasoning material is aluminum oxide ($Al_2O_3$). In another embodiment, the seasoning material is aluminum nitride (AlN). The seasoning material may be deposited to a thickness that prevents arcing, for example, between about 0.1 microns to about 10 microns, such as about 1 micron to about 3 microns. In one example, method 360 may be an ALD process, and the seasoning material may be deposited at a thickness of about 5 angstroms to about 10 angstroms per deposition cycle. In such an example, operations 362-370 are repeated until a seasoning material of a preferred thickness is formed.

The method 360 may be a PECVD or PE-ALD process, in one example. In a PE-ALD process, radicals are generated by an HDP RF source. PE-ALD occurs at relatively low temperatures, which are below the relative low temperature limit (<100° C.) of the chamber wall or other chamber components. The method 360 may take place during preventative maintenance, corrective maintenance, or as otherwise needed to make sure all metallic parts, such as the chamber body, are sufficiently coated to substantially prevent chamber arcing. In one example, the method 360 may occur subsequent to a thin film formation process in which a thin film is formed on the substrate 190.

FIG. 4A is schematic view of a portion of a process chamber 480 according to another embodiment described herein. The process chamber 480 is substantially similar to the process chamber 100, but includes a ring shaped gas distributor 418 instead of the ring shaped gas distributor 118. The gas distributor 418 is coupled to the chamber body 116. The gas distributor 418 includes tapered outer sidewalls to engage the internal surface 105 of the chamber body 116. In one example, the diameter of the outer sidewall of the gas distributor 418 is larger at a top portion thereof compared to a lower portion thereof. The degree of taper of the sidewall of the gas distributor 418 may be selected to be the same or similar to the taper of the internal surface 105. In such an example, the gas distributor 418 may be maintained in position via a wedge fit, and thus facilitating quick maintenance or exchange of the gas distributor 418. Precursor or process gases are supplied to the ring shaped gas distributor 418 through a gas supply line 138, which interacts with at least one gas entrance port disposed on the gas distributor 418. It is contemplated that more than one gas supply line 138 may be utilized.

Figure 4B:
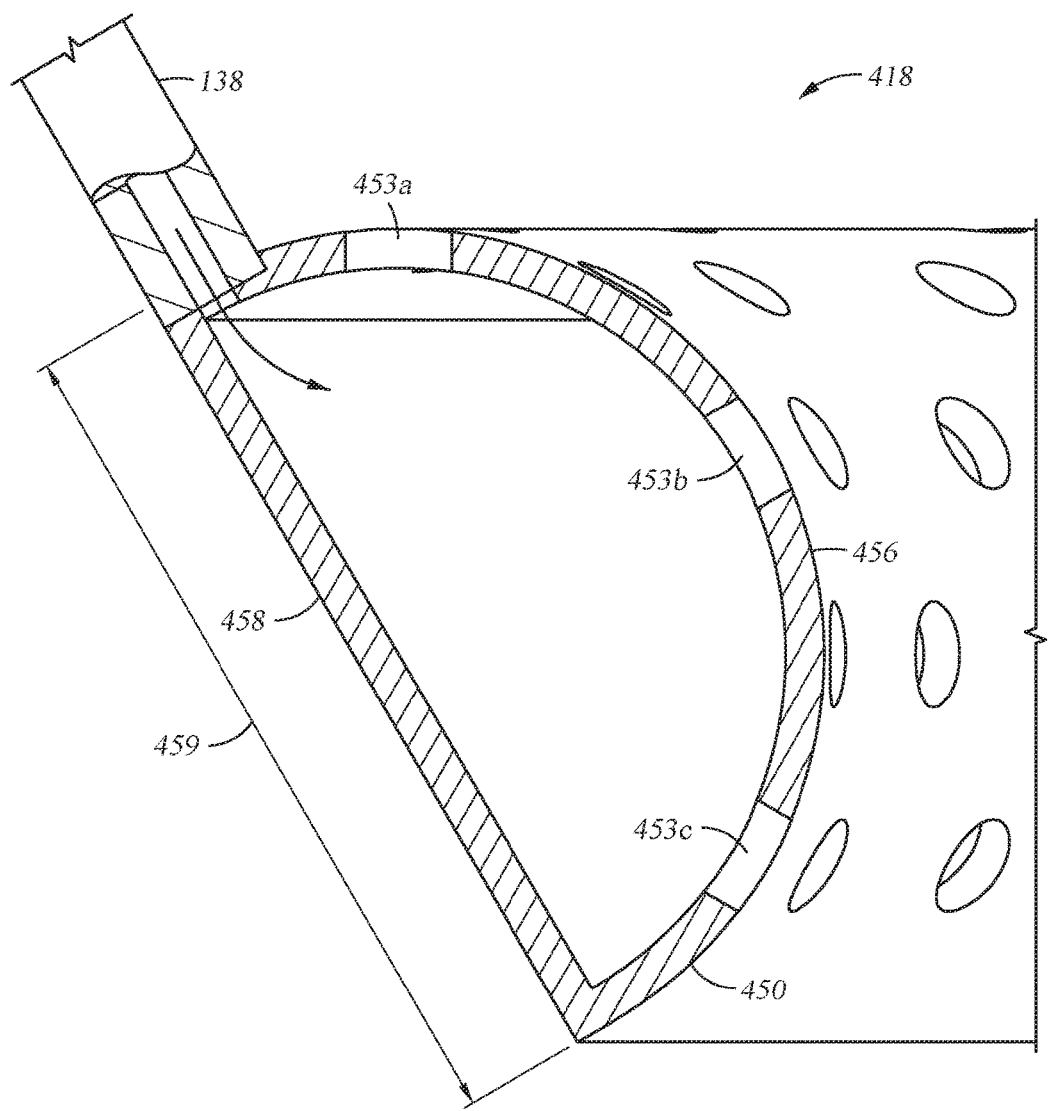
FIG. 4B is a schematic, cross-sectional view of a ring shaped gas distributor according to another embodiment described herein.

FIG. 4B is a schematic, cross-sectional view of the ring shaped gas distributor 418 according to one embodiment. The ring shaped gas distributor 418 has a ring shaped gas distribution body 450. The ring shaped gas distribution body 450 includes a first, curved surface 456 and a second, flat surface 458. A plurality of gas distribution 453a, 453b, and 453c (three are shown), are disposed on the first, curved surface 456 of the ring shaped gas distribution body 450 and are adapted to direct process gas to locations within a process chamber. The first, curved surface 456 of the ring shaped gas distribution body 450 is positioned opposite the second, flat surface 458, which engages the chamber body 116. The second, flat surface 458 has a height 459 of between about 5 mm and about 30 mm. In one example, the first, curved surface 456 of the ring shaped gas distribution body 450 may include gas distribution ports 453a, 453b, 453c to direct gas inwards to facilitate seasoning of the internal surface 105 of the chamber 480 as shown in FIG. 4A. In one embodiment, each of the plurality of gas distribution ports 453a, 453b, 453c is about 0.5 mm to about 3 mm in diameter, such as about 1 mm in diameter.

The plurality of gas distribution ports 453a, 453b, 453c may be arranged in a plurality of rows. The rows may be evenly distributed around the ring shaped gas body 450, for example, across the first, curved surface 456. The gas distribution ports 453a, 453b, and 453c of FIG. 4B may be configured in a first row. The first gas distribution port 453a is positioned to direct exiting gas at an angle different from the second gas distribution port 453b. The third gas distribution port 453c may also be positioned to direct exiting gas at an angle different from the second gas distribution port 453b and different from the first port 453a. Furthermore, in another example, each row of the plurality of gas distribution ports 453a, 453b, 453c may be adapted to direct exiting gas at a different angle than adjacent rows. The variations in the exit angle between gas distribution ports 453a, 453b, 453c may be controlled by the diameter of the first, curved surface 456 of the gas distributor 418. The relative difference of the exit angles between adjacent gas distribution ports 453a, 453b, 453c may be between about 15 degrees and about 30 degrees. In one embodiment, the spacing between adjacent gas distribution ports 453a, 453b, 453c may be between about 1 cm and about 3 cm, such as about 1 cm.

Benefits of the disclosure include the reduction of chamber arcing and arcing related defects, as well as increased chamber longevity and decreased maintenance costs through deposition of a seasoning material in portions of the chamber that are susceptible to arcing.

While the description herein has made reference to an HDP-CVD chamber, it is to be understood that the disclosures herein are applicable to other semiconductor equipment tools as well, such as PECVD process chambers, etch process chambers and PE-ALD process chambers.

While the foregoing is directed to embodiments of the present disclosure, other and further embodiments of the disclosure may be devised without departing from the basic scope thereof, and the scope thereof is determined by the claims that follow.

The invention claimed is:

1. A ring shaped gas distributor for distributing seasoning gas in a lower portion of a plasma processing chamber below a substrate support of the plasma processing chamber, comprising:
   a ring shaped body having a semi-toroidal shape with a first portion having a first diameter and a second portion having a second diameter, the first diameter greater than the second diameter, the ring shaped body having a flat surface and a curved surface defining a volume therein, the flat surface extending from the first portion to the second portion;
   at least one gas entrance port formed through the curved surface of the ring shaped body;
   and
   a plurality of gas distribution ports formed through the curved disposed on a first surface of the ring shaped body, the plurality of gas distribution ports arranged in a plurality of evenly distributed rows, the plurality of evenly distributed rows of gas distribution ports radially aligned with an interior centerline of the ring shaped body, wherein the plurality of gas distribution ports in a first row of the plurality of evenly distributed rows is adapted to direct a gas at an exit angle different from an exit angle of the plurality of gas distribution ports in a second row of the plurality of evenly distributed rows, and wherein a variation of exit angles between adjacent rows of the plurality of evenly distributed rows is between 15 degrees and 30 degrees and a spacing between each gas distribution port of the plurality of gas distribution ports is between 1 cm and 3 cm.

2. The ring shaped gas distributor of claim 1, wherein the plurality of evenly distributed rows are evenly distributed across the curved surface.

3. The ring shaped gas distributor of claim 1, wherein the at least one gas entrance port is formed through the curved surface adjacent to the flat surface to inject the gas into the volume parallel to the flat surface.

4. The ring shaped gas distributor of claim 1, wherein the ring shaped body comprises a material selected from the group consisting of aluminum, aluminum oxide, and aluminum nitride.

5. The ring shaped gas distributor of claim 1, wherein each of the plurality of gas distribution ports has a diameter of between about 0.5 millimeters and about 3 millimeters.

6. The ring shaped gas distributor of claim 1, wherein at least one of the gas distribution ports is configured to direct gas outward relative to a centerline of the ring shaped gas distributor.

7. A ring shaped gas distributor for distributing seasoning gas in a lower portion of a plasma processing chamber below a substrate support of the plasma processing chamber, comprising:
   a ring shaped body having a semi-toroidal shape with a first portion having a first diameter and a second portion having a second diameter, the first diameter greater than the second diameter, the ring shaped body having a flat surface and a curved surface defining a volume therein, the flat surface extending from the first portion to the second portion;
   at least one gas entrance port formed through the curved surface of the ring shaped body; and
   a plurality of gas distribution ports formed through the curved surface of the ring shaped body, the plurality of gas distribution ports arranged in a plurality of evenly distributed rows, wherein the plurality of gas distribution ports in a first row of the plurality of evenly distributed rows adapted to direct a gas at an exit angle different from an exit angle of the plurality of gas distribution ports in a second row of the plurality of evenly distributed rows, and at least one of the gas distribution ports is configured to direct gas outward relative to a centerline of the ring shaped gas distributor.

8. The ring shaped gas distributor of claim 1, wherein a length of the flat surface from the first portion to the second portion is between about 5 mm and about 30 mm.

9. The ring shaped gas distributor of claim 1, wherein the plurality of gas distribution ports distribute the gas radially inward from the flat surface.

10. The ring shaped gas distributor of claim 7, wherein the plurality of evenly distributed rows are evenly distributed across the curved surface.

11. The ring shaped gas distributor of claim 7, wherein the at least one gas entrance port is formed through the curved surface adjacent to the flat surface to inject the gas into the volume parallel to the flat surface.

12. The ring shaped gas distributor of claim 7, wherein the ring shaped body comprises a material selected from the group consisting of aluminum, aluminum oxide, and aluminum nitride.

13. The ring shaped gas distributor of claim 7, wherein each of the plurality of gas distribution ports has a diameter of between about 0.5 millimeters and about 3 millimeters.

14. The ring shaped gas distributor of claim 7, wherein a length of the flat surface from the first portion to the second portion is between about 5 mm and about 30 mm.

15. A ring shaped gas distributor for distributing gas in a lower portion of a plasma processing chamber below a substrate support of the plasma processing chamber, comprising:
a ring shaped body having a semi-toroidal shape with a first portion having a first diameter and a second portion having a second diameter, the first diameter greater than the second diameter, the ring shaped body having a flat surface and a curved surface defining a volume therein, the flat surface extending from the first portion to the second portion, the volume having a semicircular cross section;
at least one gas entrance port formed through the curved surface of the ring shaped body; and
a plurality of gas distribution ports formed through the curved surface of the ring shaped body, wherein the plurality of gas distribution ports are arranged in a plurality of evenly distributed rows, and wherein the plurality of gas distribution ports in a first row of the plurality of evenly distributed rows is adapted to direct gas at an exit angle different from an exit angle of the plurality of gas distribution ports in a second row of the plurality of evenly distributed rows, at least one of the gas distribution ports is configured to direct gas outward relative to a centerline of the ring shaped gas distributor, and a variation of exit angles between adjacent rows of the plurality of evenly distributed rows is between 15 degrees and 30 degrees.

16. The ring shaped gas distributor of claim 15, wherein the plurality of evenly distributed rows are evenly distributed across the curved surface.

17. The ring shaped gas distributor of claim 15, wherein the at least one gas entrance port is formed through the curved surface adjacent to the flat surface to inject the gas into the volume parallel to the flat surface.

18. The ring shaped gas distributor of claim 15, wherein the ring shaped body comprises a material selected from the group consisting of aluminum, aluminum oxide, and aluminum nitride.

19. The ring shaped gas distributor of claim 15, wherein each of the plurality of gas distribution ports has a diameter of between about 0.5 millimeters and about 3 millimeters.

20. The ring shaped gas distributor of claim 15, wherein a length of the flat surface from the first portion to the second portion is between about 5 mm and about 30 mm.

* * * * *

UNITED STATES PATENT AND TRADEMARK OFFICE
CERTIFICATE OF CORRECTION

PATENT NO. : 10,208,380 B2
APPLICATION NO. : 15/334431
DATED : February 19, 2019
INVENTOR(S) : Lin Zhang et al.

Page 1 of 1

It is certified that error appears in the above-identified patent and that said Letters Patent is hereby corrected as shown below:

On the Title Page

In item (74), in Column 2, in "Attorney, Agent, or Firm", Line 1,
delete "Patterson | Sheridan LLP" and insert -- Patterson + Sheridan LLP --, therefor.

In the Claims

In Column 8, Line 9, in Claim 1, after "curved" delete "disposed on a first".

Signed and Sealed this
Sixteenth Day of April, 2019

Andrei Iancu
*Director of the United States Patent and Trademark Office*